United States Patent [19]
Wang

[11] Patent Number: 5,627,871
[45] Date of Patent: May 6, 1997

[54] X-RAY TUBE AND MICROELECTRONICS ALIGNMENT PROCESS

[75] Inventor: Chia-Gee Wang, Millwood, N.Y.

[73] Assignee: Nanodynamics, Inc., Houston, Tex.

[21] Appl. No.: 509,532

[22] Filed: Jul. 31, 1995

Related U.S. Application Data

[63] Continuation-in-part of Ser. No. 74,786, Jun. 10, 1993, abandoned.

[51] Int. Cl.$^6$ .................................................. H01J 35/32
[52] U.S. Cl. ................................ 378/121; 378/102
[58] Field of Search ............................ 378/119, 121, 378/137, 138, 140, 143, 101, 102

[56] References Cited

U.S. PATENT DOCUMENTS

| | | | |
|---|---|---|---|
| 3,668,454 | 6/1972 | Shimura | 378/138 X |
| 5,044,001 | 8/1991 | Wang | 378/43 |
| 5,090,043 | 2/1992 | Parker et al. | 378/121 |
| 5,422,926 | 6/1995 | Smith et al. | 378/121 |

*Primary Examiner*—David P. Porta
*Attorney, Agent, or Firm*—Ladas & Parry

[57] ABSTRACT

A compact x-ray tube assembly comprises an evacuated chamber enclosed by a ceramic tubular envelope, an attached power supply at one end connected to an emitter inside the chamber, electrostatic means for focusing a beam of electrons on a metal foil target, an end window at the other end comprising said target, the thickness and composition of the metal foil target and the e-beam energy being selected to generate a microfocused bright beam of x rays of a preselected energy. The compact assembly is useful in a method for aligning or positioning layers used in the production of microelectronics components.

16 Claims, 4 Drawing Sheets

X-RAY TUBE AND MICROELECTRONICS ALIGNMENT PROCESS

This is a continuation-in-part of application Ser. No. 08/074,786 filed on Jun. 10, 1993, now abandoned.

BACKGROUND OF INVENTION

1. Field of the Invention

This invention relates to a relatively compact, even pocket size, microfocused x-ray tube having a protruding bright beam spot. It is especially adaptable for an x-ray stepper useful for dimensional control and alignment in the manufacture of microelectronic devices such as an integrated circuit (IC) or computer chip. It is also useful for medical imaging. The invention also relates to a microelectronics alignment, positioning or dimensional control process and system.

ICs are conventionally produced by a lithographic process which includes passing light through a mask onto the surface of a silicon wafer substrate coated with photosensitive chemicals to produce an etched chip.

Over the years, etched lines have become increasingly fine and circuits more complex, resulting in ICs having a greatly increased number of components equivalent to transistors, enabling the power of the computer chips and the electronic devices utilizing them to be substantially increased.

The etching process requires that the light passed through the mask must form sharp line images. This becomes increasingly difficult for very fine lines which require much higher line resolution. Technology using ordinary light has enabled production of ICs with a minimum width of about 0.35 µm, and having components equivalent to about a few million transistors. The use of coherent light is limited to producing a line width or resolution of down to about 0.3 µm at reasonable cost. Ordinary light waves at 0.5 µm are too large to give sharp images at smaller line widths.

However, the semiconductor industry is moving toward 0.1 µm line resolution and contemplates use of 12 or more masking levels. These requirements indicate an urgent need for improvements in critical dimension controls of mask-to-wafer alignment during wafer exposure, in absolute positioning during mask writing, and in metrology in general.

2. Description of Related Art

X rays have been investigated for such needs, due to their very short wave length. The generation of x rays for IC lithography or dimension and positioning control has been a problem. Ordinary sources such as medical x-ray tubes are not useful because of production of unduly strong x rays which penetrate the mask and wafer and do not enable production of sharp images without damage to the materials.

Soft (low energy) x rays have been used for lithography and positioning, but have been produced by bulky equipment which is both expensive and not optimal for working with the relatively small wafers from which computer chips are made. For example, synchrotrons have been used to produce soft x rays for lithography.

U.S. Pat. No. 3,984,680 issued to Henry I. Smith discloses an alignment system for aligning a mask and substrate to be exposed using soft x rays. Alignment marks with regions that transmit soft x rays and regions opaque to soft x rays are provided on the mask. Geometrically similar marks are provided on the substrate. The marks on the substrate contain materials which fluoresce when struck with x rays used for alignment, i.e., emit x rays. The emitted x rays are detected. Soft x rays from an x-ray source pass through the transparent regions and are absorbed by the opaque regions of the marks on the mask. The amount of x rays striking the x ray emitting marks on the substrate is dependent on the alignment or superposition of the mask marks and the substrate marks. The magnitude of the detected emitted x rays indicates the degree of superposition, and can be used as a basis for moving the mask or substrate into the desired registration. The system of this patent requires operating in a vacuum.

Another alignment system is described in U.S. Pat. No. 3,742,229 issued to Henry I. Smith et al. In this patent, soft x rays are used with a first registration means on a mask and a second registration means on a substrate.

U.S. Pat. No. 4,238,685 issued to Peter Tischer describes an alignment system employing displacement of x-ray beam source location with respect to a mask in fixed association with a semiconductor body.

U.S. Pat. No. 3,743,842 issued to Henry I. Smith et al. discloses a lithographic process using soft x rays.

U.S. Pat. No. 5,044,001 issued to Chia-Gee Wang discloses a method and a apparatus for investigating materials in which x rays are generated in a thin metal foil inside an evacuated x-ray tube, and a specimen outside the tube is exposed to the generated x rays. The disclosure of U.S. Pat. No. 5,044,001 is incorporated herein by reference.

U.S. Pat. No. 3,668,454 issued Jun. 6, 1972 to Shimura discloses a fine focus x-ray tube having a target at one end comprising a base with an opening containing a vertex and a hole or slit at said vertex across which a thin foil target is applied. An electron beam is converged by a converging coil and a deflecting coil. Said coils are arranged around the outside of said tube, said electron beam is focused in said vertex hole or slit and the position of the focus can be moved by means of the deflecting coil.

SUMMARY OF THE INVENTION

According to the present invention there is provided a method for aligning or positioning layers used in the production of microelectronics components, which comprises placing a first layer, having a small selectively positioned transparent area, in closely spaced superposed relation to a second layer, said second layer having an alignment dot selectively positioned on one of its surfaces, said alignment dot being composed of four different metal elements separately located in 4 substantially equally spaced adjacent areas of said dot, positioning close to said transparent area an end-window x-ray tube having a metal foil coated on the inside of said window, generating a bright microfocused x-ray beam in said metal foil, passing said x-ray beam through said transparent area, a surface area of said first layer surrounding said transparent area being opaque to said x-ray beam, said x-ray beam passed through said transparent area irradiating at least a portion of said dot and generating fluorescent x rays from at least one of said metals, selectively detecting said fluorescent x rays generated from each of said metals, and adjusting the superposed relation of said first and second layers so that the detected x rays from all 4 different metals reach a predetermined level.

Also provided according to the invention is a compact x-ray tube assembly of about 9 inches or less in axial length and a diameter of about 4 inches or less comprising an evacuated chamber enclosed by a ceramic tubular envelope, a power supply attached at one end of said envelope and connectable to an electric current supply, emitter means within said chamber and adjacent to said power supply, said emitter means ending in a fine element for emitting an e-beam, electrostatic focusing means within said chamber for focusing said e-beam on a metal foil target, said emitter means and said electrostatic focusing means connected to said power supply, an end window at the opposite end of said envelope comprising an end wall, a window transparent to x rays located in said end wall, an inside surface of said window having thereon said metal foil target, the thickness and composition of the metal foil target and the e-beam energy being selected to generate a microfocused bright beam of x rays of a preselected energy.

DESCRIPTION OF THE PREFERRED EMBODIMENTS

Figure 1:
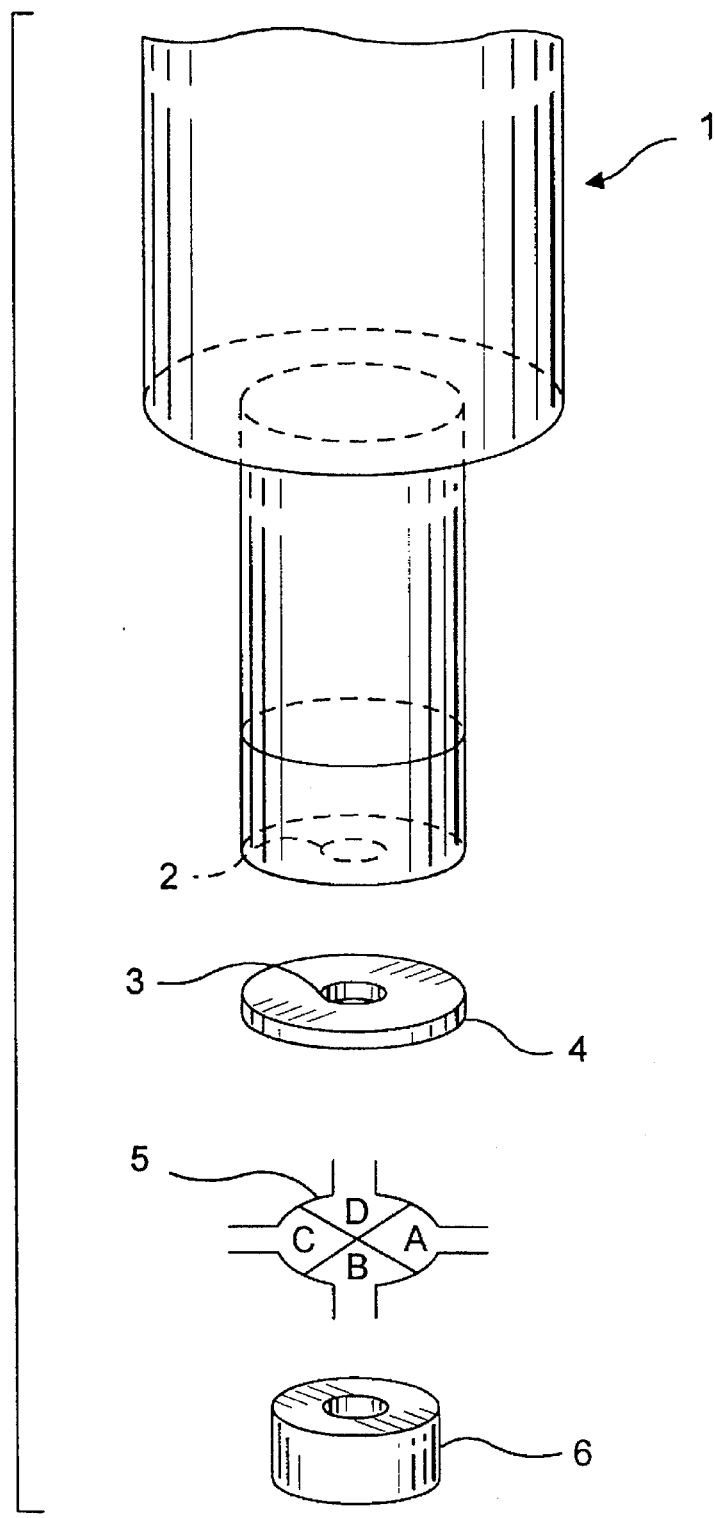
FIG. 1 is a schematic illustration of the microelectronics alignment system of the present invention.

The x-ray tube of the present invention can be understood best from first considering the history of x-ray tube development over the previous 100 years.

Early Fixed Cathode X-ray Tubes

These tubes consisted of a simple, evacuated glass envelope, a cathode filament and a fixed anode. By the application of a large potential difference between the anode and the cathode, an intense electron beam (e-beam) is directed at the anode. The energy of the e-beam is converted to x rays, the majority of which are oriented in a forward direction with respect to the e-beam and give up the energy as heat, sometimes in multiple interactions. Only a small proportion of the x rays are emitted.

The x-ray flux emitted by this class of tube is severely limited, and an increase in the e-beam flux puts much more energy into heat than into x-ray emissions. Because of the heat generated within the tube, it is normally placed in an oil-filled steel (x ray absorbent) container, to provide a medium for conducting away heat. A beryllium window in the side of the container provides for the unobstructed emission of x rays. Later developments of this type of tube provide for forced cooling of the anode, but this is a serious technical challenge, because of the need to maintain a high vacuum within the inner envelope. Medical applications for x ray diagnosis often require a higher x-ray flux, and for this reason a new design of x-ray tube was required.

The Rotating Anode X-ray Tube

In what was seen at the time to be a major development, in the 1930's, the rotating anode tube was introduced. Rather than using forced cooling of the anode, it instead takes the form of a tungsten disk mounted on a shaft and rotated by a motor which is placed inside the evacuated glass envelope. The rotation of the anode allows some time for the surface to cool since only one part in a thousand of the disk surface is subject to intense e-beam bombardment at any moment.

A cup behind the filament directs the electrons emitted by the cathode filament towards the angled face of the rotating anode, where the e-beam forms an intensely illuminated spot which, seen through the side window of the steel cylinder in which the tube is contained, appears to be oval, with typical side dimensions of 100 microns for low power tubes, up to 2 mm for high power, high beam flux tubes. Even though the target rotates, internal heating is a problem. Two partial solutions have been offered by the manufacturers of rotating anode tubes; (i) use larger spot sizes when high power/high flux is required; (ii) surround the x-ray tube with oil, which is circulated through an external radiator. The price paid is loss of resolution and costly complication to the x-ray tube and the associated equipment.

A measure of the inadequacy of the rotating anode x-ray tube to meet the needs of the user is the fact that it is so highly inefficient that more than 50,000 W of electrical power is required to deliver an x-ray flux to the patient of less than 1 W. Worse, there are two classes of application for such tubes, CAT scanning and angiographic fluoroscopy, where use of the equipment must be periodically interrupted to allow the x-ray tube to cool.

End-Window X-ray Tube

A number of applications for x ray irradiation do not call for emissions from a point source, particularly materials analysis. In such cases, a simple end-window x-ray tube will suffice. A cathode emits electrons drawn electrostatically towards the target without any effective focusing. The typical target thickness results in significant heating, since most of the x rays generated by the e-beam are absorbed in the target.

There are applications where the limited flux output of the end-window tube is sufficient. Some small addition to the flux can be achieved by using oil cooling, but the relatively low quantum efficiency of the end-window tubes means that cooling can only provide for a modest increase in x-ray flux.

End-window x-ray tubes are commonly employed in material sciences. They are known for their high efficiency, convenience, and low power consumption. The end-window is typically made of a thin sheet of beryllium (Be) coated with molybdenum or tungsten as the target for the e-beam. Bremsstrahlung has a forward preference with a maximum beam flux at 45° to an e-beam of 30 kV and a smaller angle for higher e-beam energy. The Be windows used are thin enough to be transparent to the forward x rays so that there is very little attenuation of x-ray beam flux with such an arrangement. Because of the window's limited thickness, its power dissipation capacity is reduced. The space available for cooling the thin end-window is too restricted to allow for the circulation of coolants, although oil, circulating outside the window is sometimes used to help carry the heat load. The focal spot dimension is usually defined by a collimator, which cuts down the x-ray flux. The brightness reduction is particularly pronounced if the collimator aperture is set very small in order to provide a fine focal spot.

In the x-ray tube of the present invention, a very efficient, focused e-beam is produced and the design is such that the beam reaches the end-window without the requirement for a collimator and generates a highly concentrated x-ray flux in terms of spatial dimension as well as in energy distribution.

Figure 4:
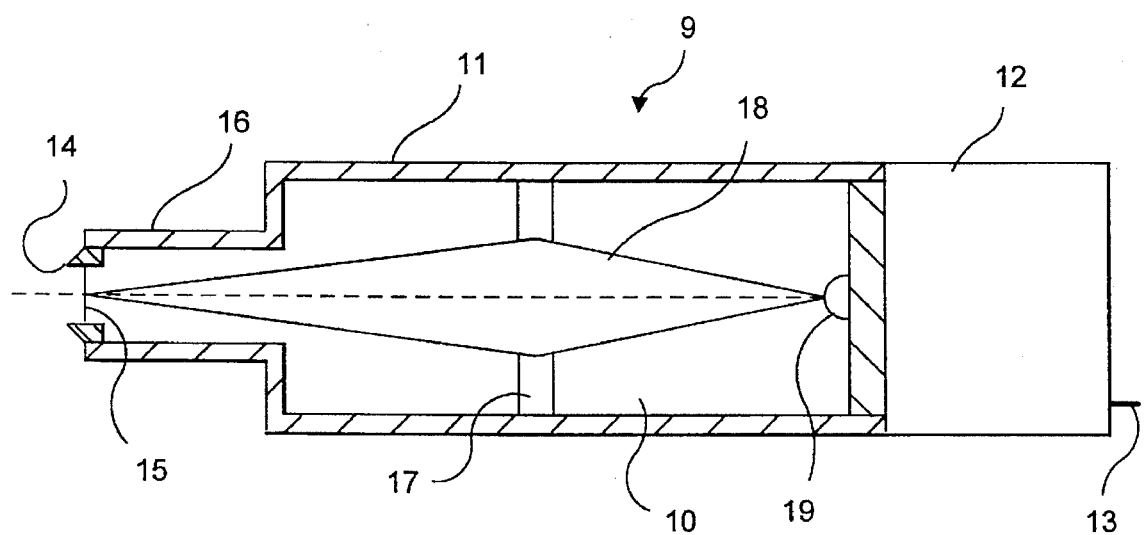
FIG. 4 is a schematic elevational view partly in cross-section of an x-ray tube according to the present invention.

An x-ray tube according to the present invention is illustrated in FIG. 4. The x-ray tube 9 comprises an evacuated tubular chamber 10 enclosed by a tubular ceramic envelope 11. At one end chamber 10 is connected to end window 14. At its other end, chamber 10 is connected to a power supply 12 which is connected by line 13 to an electrical current supply, not shown, such as a 120 V AC outlet. The power supply may be adjusted so that the energy of x-ray photons from the tube ranges from 4.1 KV to 19 KV for use in alignment of microelectronics, and for medical uses up to 100 KV. Power supply 12 comprises transformers and circuit elements for supplying current to an emitter 19 and to electrostatic lens 17. The components of power supply 12 are contained in a housing which may be made of plastic or metal, and said housing may be filled with an insulating oil.

End window 14 has on its inside surface a metal foil target 15. The end window may be mounted in a tubular extension 16 of smaller diameter than ceramic envelope 11. Tubular extension 16 may be ceramic or metal, is usually stainless steel and, being open to the interior of chamber 10, is evacuated. A typical outside diameter of tubular extension 16 is ⅝ inch. Tubular extension 16 may be surrounded by an annular magnetic coil or lens (not shown). Within chamber 10 is at least one electrostatic lens 17 which focuses e-beam 18.

Contained in chamber 10 is e-beam emitter 19 connected to said power supply 12. The e-beam emitter 19 may comprise a whisker such as a whisker of a tungsten filament. The whisker may have a diameter of several microns and a chemically etched tip of submicron size, from which e-beam 19 is generated. The e-beam spot focused on the target is of similar size as the whisker tip. The e-beam is focused by electrostatic focusing lens 17. Further focusing may be accomplished by the above-mentioned magnetic lens.

Chamber 10, and tubular extension 16 if used, is evacuated by evacuating means such as a vacuum pump; it may be baked at about 350° C. for 9 to 12 hours to de-gas ceramic and metal parts, and it then is sealed.

The x-ray tube of the invention provides an intense x-ray beam emitted from the narrow tubular extension 16. Resulting from the narrow end window design, the thin metal foil 15 and the microfocused emitted x-ray beam, the x-ray tube can be closely placed in proximity to the material or tissue to be exposed to x rays.

The provided line-emissions may be narrowly tuned, by using a metal foil target of a selected metal and of preselected thickness. Thickness of the foil can range as low as 0.1 µm or below, or can be thicker such as typically 1.0 µm or up to 2.0 µm. The thicker metal foils are used in connection with higher emitted x-ray energies of up to 100 KV.

For medical use the x-ray tube can be designed for higher x-ray energies such as 15 KV or higher for breast tissue, typically 17.5 KV; about 33 KV for dental or orthopedic use; 50 to 80 KV for chest and 100 KV for GI x rays.

Figure 5:
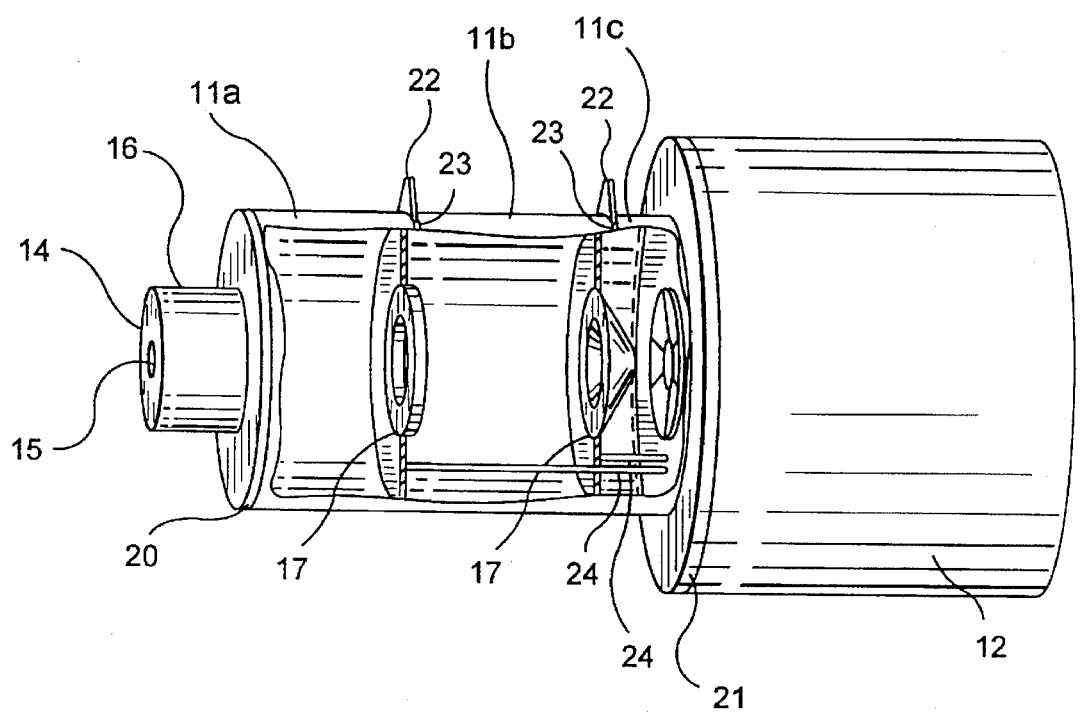
FIG. 5 is a schematic perspective view, part sectioned, of an x-ray tube of the present invention, without an outer container.

FIG. 5 shows a partially sectioned view of the x-ray tube of the present invention, in which the components are numbered as described in FIG. 4. Additionally the illustration shows that ceramic envelope 11 may be constructed in several (three shown) sections 11a, 11b and 11c. The edges of these sections are metallized and thus can be welded or soldered to each other and to anode assembly 20 which includes the end window 14 and to cathode end piece 21 which includes the e-beam emitter 19. Cathode end piece 21 is joined to power supply 12. Current for electrostatic lenses 17 and for emitter 19 may be supplied from power supply 12 through lines 22 external to ceramic envelope 11 by simple connection of lines 22 to the metal welds 23, or internally from the power supply 12 through leads 24. Connecting lines 22 externally has the advantage that the connections can be made easier are more stable outside the evacuated chamber 10.

Figure 6:
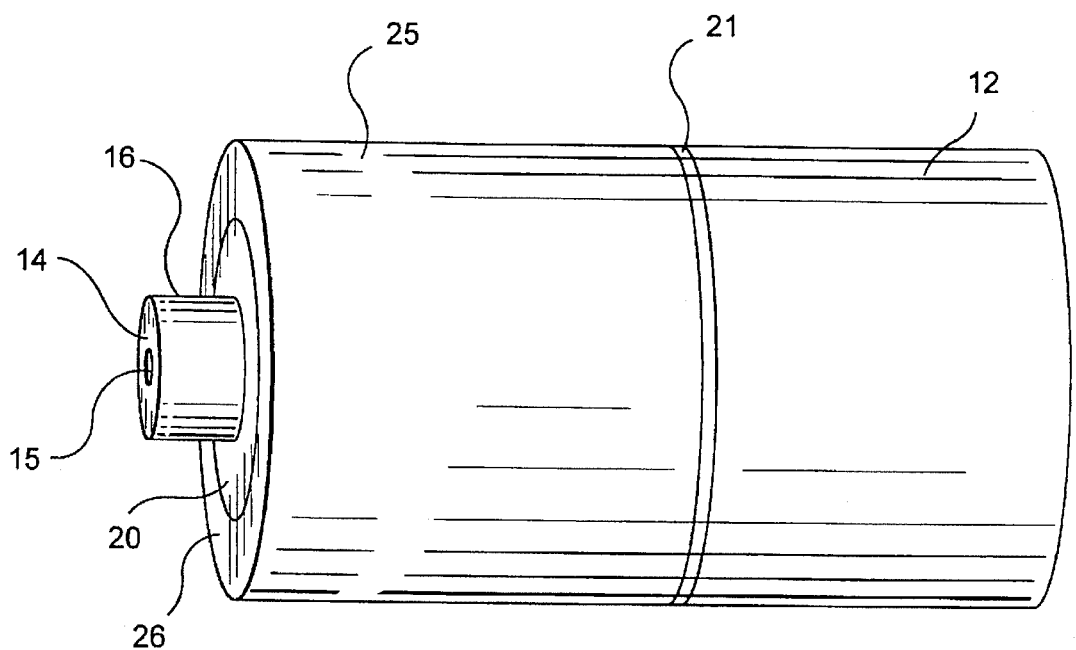
FIG. 6 is a schematic perspective view of the x-ray tube of FIG. 5, with an outer container.

FIG. 6 shows a perspective illustration of the x-ray tube of the invention, with components having reference numbers corresponding to those of FIG. 5, and also showing outer container 25 surrounding ceramic envelope 11 (FIG. 5). The outer container 25 has an end wall 26 at least partly surrounding anode assembly 20. Outer container 25 and end wall 26 may be constructed so that end window 14 is flush with end wall 26 or only slightly protrudes.

The annular space between the outside of ceramic envelope 11 and the inside of outer container 25 preferably is filled with an insulating oil which is useful to suppress electrical leakage due to the high internal voltages.

The ceramic envelope may be made of various insulating materials, such as Mg and Al oxides.

Use of a ceramic envelope instead of a glass tube permits precise engineering of the x-ray tube and through metal welds, stable connection to the power generator and other components. Due to stress created by heat build-up, the joints between glass tubes and metal components tend to fail as a result of metal expansion. Furthermore, the precise dimensional control possible with ceramic components enables production of x-ray tubes all having essentially the same dimensions. As a result, the ceramic x-ray tubes can be designed to deliver x rays having a pre-selected power, and all those designed for a particular pre-selected power can be made from like components, without the need for specially tuning the focusing lenses and other components due to differences in dimensions between different tubes. Also, use of the ceramic envelope enables a smaller tube size than use of glass tubes.

It is important for lens 17 to be an electrostatic lens. With such a focusing lens, the voltage applied to the lens is proportional to e-beam energy. This enables the e-beam energy to be set at a selected energy, e.g. from 15 KV to over 100 KV with a proportional change in the voltage of lens 17. This tuning cannot be readily accomplished with use of magnetic coils as focusing lenses.

Due to the very small diameter of the emitter 19 whisker, the current supplied to the emitter must be low, usually under 10 W. The present x-ray tube design including use of electrostatic lens 17 is extremely efficient, so that 99% or more of the e-beam electrons are delivered to the target, enabling an x-ray flux of about 1 W. By use of an end window target, the atoms of the target function as a filter. This results in a higher proportion of line emission than continuous emission of x rays, and accordingly the useful brightness of the x-ray spot is increased. With conventional x-ray tubes a separate filter is used, but the filter creates a plurality of emission spots, and therefore a reduction in signal to noise ratio.

The end window may be designed for optimum line emission for the desired use of the x-ray tube. Different target metals provide different line emission energy, e.g. the $K_\alpha$ lines being as follows:

| | |
|---|---|
| U | 98 KV |
| W | 59 KV |
| La | 33 KV |
| Mb | 17.5 KV. |

In the case of x rays for imaging tissues, higher energy x rays are needed for thicker tissues; from availability and easy substitution of a number of different x-ray tubes of the present invention, each having a different x-ray energy, the appropriate one can be selected for the size of the tissue or for other tasks.

In contrast, conventional x-ray machines may have a power supply weighing a ton, and a massive x-ray tube assembly. Substitution of different machines is not readily possible, without having a large number of comparatively huge, expensive machines in different locations.

With reference to FIGS. 4 and 5, ceramic envelope 11 may have a diameter of about 2 inches or less, typically about 1 inch. The tubular extension 16 may have a length of 1 inch or less, typically ½ inch, and the total length of extension 16 and ceramic envelope 11 along the e-beam axis may be about 5 inches or less, typically about 2½ inches. The power supply 12 may have a diameter of about 4 inches or less, typically about 2 inches, and a length of about 4 inches or less, typically 2 inches. The outer container shown in FIG. 6 may have a diameter of about 4 inches or less, typically about 2 inches, and a total length, with tubular extension 16, of about 5 inches or less, typically about 2½ inches. Normally the diameter of the outer container 25 will be the same as the diameter of power generator 12.

Conventional large x-ray machines produce an x-ray spot diameter from 300μ (useful for screening) and down to about 100μ for distinct images. The x-ray tube of the present invention can produce a bright spot down to about 10μ for clear tissue images, and from 10μ to 10 nm for x rays of cells and cell components.

In the x-ray tube of the present invention, electrons are pulled from the whisker of a tungsten filament and are focused by an electrostatic lens which projects the whisker image onto the end-window target. Greater than 99% of all electrons pulled from the whisker are focused onto the end-window target, converting almost the entire current load of the device into an e-beam flux striking the target. This million fold improvement in the e-beam generator efficiency as compared to an electron microscope provides the flux needed for a bright x-ray beam. The thin end-window with its increased transparency over the traditional end-window design gives better x ray generating efficiency. The power density and heat load for this arrangement is discussed below.

As electrons enter the end-window target, each inelastic scattering with a target nucleus has a finite probability of generating an x-ray photon in the fluorescent line or in forward bremsstrahlung. Electron-electron scattering does not generate x rays at the relatively low x-ray tube energies used. The elastic scattering does not cause the beam to lose energy, only to smear the directional beam distribution. Because the target is transparent to x rays, the x-ray flux can be inherently as high as the rate of electrons encountering target nuclei. Any bremsstrahlung emissions produced have a preferred forward direction of 45° with a 30 kV e-beam, and a smaller angle at higher energy, and, as the bremsstrahlung photons move through the target material, the target atoms will serve as a "filter grid" to interact with the photons. This "grid" absorbs high energy bremsstrahlung emissions and re-emits them mostly as characteristic line-emissions in a space still within the x-ray focal spot. This fluorescence is different from a conventional filter grid where the line-emissions from the grid occur over a large area and serve only to blur the image. In other words, an end-window design can combine the target and the filter into a single unit for a highly concentrated and flux enhanced focal spot. In contrast, the usual solid target would not only have blocked the forward x-ray flux, but also have reduced the low side-emitted x rays further by the use of a separate filter grid. This is an important first consideration in the design that provides a high x-ray line generating efficiency.

Energy Spectrum Concentrated In Line Emissions

The optimum distribution of x-ray spectrum can be achieved with minimum radiation dosage if the x-ray beam energy is closely matched to the functional requirements of the tube. An ideal result can be obtained with K-line fluorescent radiation, provided the appropriate target is selected. Fortunately, many metals are available with K-line energies covering the critical range from 15 kV to 98 kV.

Conventional solid target x-ray equipment is not able to offer the advantages of K-line radiation for several reasons. First, the dominant bremsstrahlung emissions have a forward orientation, with respect to the e-beam, and the solid angle subtended by the x-ray flux emerging from the side window is small. As a result, the proportion of the x-ray flux emerging from the side window is very small in relation to the e-beam flux. Secondly, in order to concentrate the x-ray spectrum at the energy level most appropriate for the target thickness and density, a filter grid is used. While the grid absorbs the photon flux with higher and lower energy portions preferentially, it also reduces the brightness of photon flux in the desired energy window.

As electrons enter a metal target and slow down via inelastic Coulomb scattering, they lose energy in multiple steps. When the electron energy is higher than the absorption edge of the target element, the Coulomb interaction with a target nucleus may be bremsstrahlung or fluorescent. The bremsstrahlung emissions have a forward preference and a most probable energy distribution of about ⅔ of the e-beam energy. In order to make this most probable bremsstrahlung emission coincide with the resonant fluorescent emission, the V-peak is often set to 50% above the K-absorption edge. A molybdenum target, for example, has a K-edge at 20 kV and would emit a bright $K_\alpha$ line at 17.5 kV if the V-peak were set at 30 kV. Having a most probable bremsstrahlung energy of ⅔ of the V-peak energy also implies that most of the x-ray generating interactions, with electron energy below 30 kV, would have emitted a photon and fallen below the K-absorptive edge. This interaction of electron and target nucleus can be compared with the interaction of an x ray and a target atom. There is, however, an important difference between an e-beam and an x-ray beam in their ability to cause an inner shell ionization. Both beams can lead to inner shell ionization of the target atom, but an x-ray beam, being more penetrating, can reach the inner shell "directly" and cause a giant resonant scattering for inner shell ionization, while an e-beam, undergoing Coulomb scattering prior to the resonant inner shell scattering, may have already lost too much energy, fallen below the K-edge level, and can no longer produce the inner shell ionization. If either beam can reach the targeted inner shell with sufficient energy, each will exhibit a similar ratio of non-resonant versus resonant scattering cross section as determined by the basic electromagnetic interactions. Such a difference can also be measured by the width of the respective energy windows within which the resonant scattering cross section occurs.

The mean-free-path for inelastic scattering of a 20 KeV x-ray photon in a metal is measured in millimeters, while that of an electron is measured in microns. In other words, the giant inelastic K-edge verses non-K-edge cross sections seen in x-ray scatterings, can be compared with the resonant K-edge versus bremsstrahlung of the e-beam scattering if the e-beam energy is tuned to provide for such a possibility. Within such an energy window, the ratio of cross sections of the e-beam between the inelastic K-edge and the inelastic bremsstrahlung becomes statistically comparable to that of the x-ray cross sections. The usual power supply for an x-ray tube, however, does not allow for the necessary precise energy control as it provides a V-peak level with large ripples by having an AC source. As such, it would miss much of the resonant energy window.

Resonant e-beam scattering involving an inner shell ionization of a target atom would produce mostly fluorescent $K_\alpha$-line emissions. Such K emissions can be compared with the wiggler of synchrotron radiation. In a synchrotron wiggler, the e-beam encounters a sharply alternating magnetic field. X-ray photons are emitted in order to balance momentum change whenever a change of direction is forced upon the electron. No heat can be generated in a wiggler because there is no solid matter and no phonons in the vacuum that can share the energy with the e-beam. In our finely tuned x-ray tube, the e-beam scattering cross sections would follow the same statistics of scattering cross shown for x-ray absorption, with the majority of the flux being fluorescent $K_\alpha$ emissions and only a small fraction bremsstrahlung Coulomb scattering. This is a second important consideration: to provide a desired x-ray flux with a minimum of white x-ray radiation. Such a mode of x-ray generation more resembles a synchrotron wiggler than a traditional x-ray tube. Heat load on the target end window would still arise from multiple non-x-ray generating scattering and from Auger emissions, but these will constitute only a fraction of the total energy load of the e-beam as determined by the cross section statistics.

Focused E-beam and Concentrated X-ray Spot

When a focused e-beam with a fine-tuned energy strikes a thin end-window target, the power density of the beam spot is high but the temperature increase can easily be estimated. Let W be the total heat load for a beam spot $r_0$ in Watts, and let $\beta$ be the thermal conductivity in Watt/cm-°C. (at 100° C., values of $\beta$ for various materials are, Be: 1.68; Diamond: 17; isotopically pure C-12 Diamond: 35; Au: 3.13; Mo: 1.35; W: 1.63; and Sb: 0.22). Assuming that the isothermal contour in the solid is a hemisphere with area $2\pi r^2$, and ignoring the black body radiation, x rays, and Auger emissions, then the upper limit of heat load W becomes the power load. Using dT/dr as the temperature gradient, $$W = 2\beta \pi r^2 dT/dr$$

and rearranging the equation, $$\Delta T = \int_{r_0}^{r_1} \frac{W dr}{2\beta \pi r^2} = \frac{W}{2\pi \beta} \left( \frac{1}{r_0} - \frac{1}{r_1} \right) \approx \frac{W}{2\pi \beta r_0}, \text{ with } r_1 > r_0$$

When W=10 Watts, $r_0$=10µ and for a Be window, $2\pi\beta$=15, which yields $\Delta T$=600° C. as an upper limit of temperature.

In the present x-ray tube invention, much of the e-beam generates x rays instead of heat load, in contrast to current x-ray equipment with solid target, where the e-beam generates mostly heat load with only a small x-ray flux, typically under 100 milliWatts. A focal spot much smaller than 10µ with a proportionately lower power load may be produced by the present inventive x-ray tube.

The x-ray tube is accordingly very useful for microelectronics.

The production of ICs is heavily dependent on dimensional and positional feedbacks throughout the manufacturing process. Critical dimension (CD) metrology currently makes use of the scanning electron microscope (SEM), particularly the very low energy SEM that limits radiation damage to the top most surface layer of a wafer. However, an SEM is expensive and requires an evacuation process which slows production. Another CD technique makes use of a confocal microscope whose laser interference pattern provides a line resolution at a fraction of the photon wavelength, but it suffers from extremely shallow focal depth. Proposed x-ray steppers have considerable focal depth, but are limited by spot size and beam brightness, and by the need for an iterative process to reach the optimum alignment position.

The present invention provides an x ray positioning technique that uses a focused x-ray beam to adjust mask-to-wafer alignment, or mask to anchor alignment in direct writing for mask fabrication, without iteration of the alignment signals or wasted mechanical movement. The positioning signals have very large focal depth, and have an accuracy measured in nanometers.

The present x-ray tube is of the end-window type. It emits intense x-ray photons with a beam size typically of 10 µm, and the beam spot can be focused to 10 nm with a magnetic lens. The energy of the x-ray photons from the tube can be tuned between a low of 4.1 KV to a high of typically 20 or 20–30 KV when the tube is used for microelectronics alignment.

At low energy operation, x-ray photons are concentrated at 4.1 KV, which can excite Auger electrons of calcium in a resist. At high energy operation, x-ray photons can excite transition metals such as Ti, V, Cr, Mn, Fe, Co, Ni, Cu, Zn. Four of these metals are used for positioning. At high energy, the x-ray photons are relatively transparent to the resist and silicon wafer. Therefore, an alignment spot or dot, hereinafter called an ABCD dot, can be positioned at the back of the wafer. A mask is used which for example may be a silicone oxide membrane having a pattern such as in gold on the upper surface, i.e. the surface facing away from a silicon wafer which is to be etched. Typically, the superposed mask and silicon wafer are spaced by about 10 µm from each other. The mask can include a transparent area surrounded by a spot or area opaque to the high energy x-ray photons, such as a one micron hole in a 3 µm thick gold spot. Preferably the pattern is on said surface and the spot opaque to x rays is on the lower surface of the mask which faces the substrate or silicon wafer. A gold pattern mask in general has a pattern thickness of 1 µm. Corresponding to the hole in the gold spot, fluorescent spots are attached to a surface of the wafer for alignment, especially to the back side (the side facing away from the mask). Each mask can have more than one spot for alignment to prevent rotational misalignment. The alignment holes in the gold can be laser drilled holes e.g. of diameter 10, 5, 2, 1 or 0.5 µm.

The x-ray tube of the invention provides a bright x-ray beam originating from a small focal spot, emits most line-energies, shines on the alignment spot and creates 4 different fluorescent signals from 4 correspondingly different elements A, B, C and D (FIGS. 2 and 3), with each signal indicating a different directional correction. Alignment is accomplished when all 4 signals (counting rates) reach certain predefined levels.

The bright focused x-ray beam is engineered to emerge from the neck of a small end-window design. The x-ray beam spot can be placed right next to the mask aperture (within 1 mm) so that much of the intensity of the x-ray beam can be utilized without need for an x-ray lens (such as x-ray fiber concentrator).

In the end-window tube design, an e-beam is focused on a small end-window target spot and provides the desired line emission. As electrons enter a metal target and slow down via Coulomb interaction, they lose energy in multiple steps. When the electron energy is higher than certain absorption edge of the target material, the interaction can be bremsstrahlung (continuum) or fluorescent (lines). When the electron energy is very near the edge but slightly above, the interaction is dominated by the resonant fluorescent absorption. As soon as the energy falls below the edge, only the continuum continues until no energy is left. This spectrum of mixing continuum with lines is true for all solid targets. Therefore, the electron beam energy for any x-ray tube is generally described by E-max or E-peak. For a thin film end-window target, on the other hand, there is an additional design parameter that can define the x-ray spectrum; it is the thickness of the film. The electron beam energy can be started at just above the edge producing mostly line emissions. The thickness is calculated to terminate the x-ray generation as soon as the energy falls below the edge, thereby eliminating the undesired continuum emissions at energy below the line emissions. In such an end-window design, the ratio of line versus continuum is very different from that of a solid target. Most of the x-ray photons can be the desired emissions using such an end-window design.

The line emissions can be selected by the use of different target elements in order to obtain different character emissions. For a typical x-ray tube, filter materials are typically selected using the same material as that of the target in order to obtain the maximum transparency of the desired line emissions while absorbing most strongly the x-ray energies just above the absorption edge in order to enhance the line-continuum ratio. In the end-window design, the target and the filter are combined into the same thin end-window material. This thin target material can provide the desired x-ray spectrum, but cannot hold the vacuum, nor conduct and dissipate the concentrated heat load. Therefore, the thin film is coated on an x ray transparent support such as beryllium (Be) whose low Z provides the highest transparency for x-ray photons.

Focusing of the e-beam of an x-ray tube can be electrostatic, electromagnetic, or a combination of the two. The preferred design of the invention is an electrostatic focusing lens housed in the tube, and a further magnetic coil lens housed outside the tube (FIG. 4).

The fluorescent x rays from the 4 different elements of A, B, C and D of the alignment dot are detected by an x-ray detector which distinguishes the four metals. To help the detector resolve the K lines of the four metals, the choice of the four metals elements can be selected from every other element on the periodic table, instead of from neighboring elements.

The x-ray detector is energy sensitive (it can distinguish K fluorescent lines of four of the nine elements considered) and can be a high resolution proportional counter, or a silicon diode array with fairly thick depletion region (<40 µm) in order to provide reasonable quantum efficiency for x-ray measurements.

The x-ray detector can be made with a donut shape as shown in FIG. 1, so that it will pass all the direct unscattered x-ray beam and receive maximally the fluorescent counts from the ABCD dot.

As illustrated in FIG. 1, the x-ray tube 1 of the invention emits a bright concentrated beam through end window 2 positioned near an alignment aperture 3 in mask spot or region 4. The photon flux passes through the small aperture 3 and impinges on the ABCD dot which is on the surface of a silicon substrate (not shown) facing the mask or on the opposite or backside substrate surface. A, B, C and D represent four different metals which emit fluorescent x rays, selectively detectable by detector 6. Detector 6 may be a Si (Li) detector.

Note that if the beam spot were to be located several mm away inside a glass tube typically found in most conventional high powered x-ray tubes, then the beam would have to be concentrated outside the tube in order to have enough photon flux to reach and pass through the small alignment aperture in the mask and perform the designated alignment functions. The pocket size microfocused x-ray tube of the present invention with its extremely bright beam spot protruding and ready to be placed next to an aperture on a mask therefore is very efficient.

Figure 2:
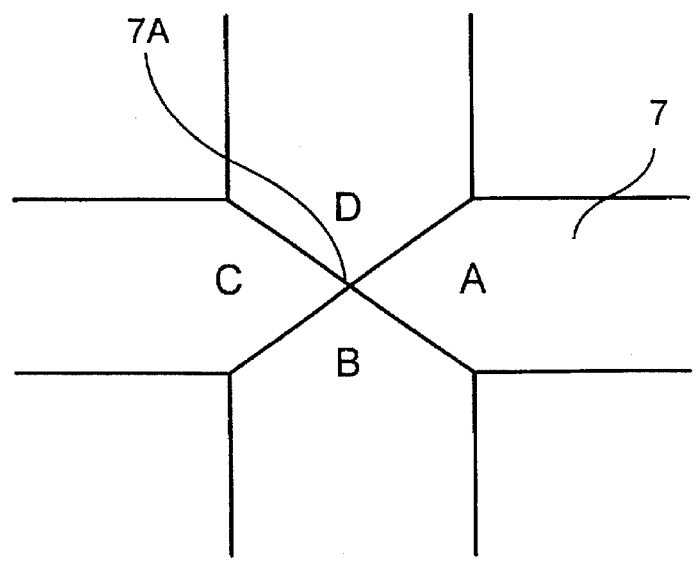
FIG. 2 is a diagrammatic representation of an alignment dot used in the present invention.
Figure 3:
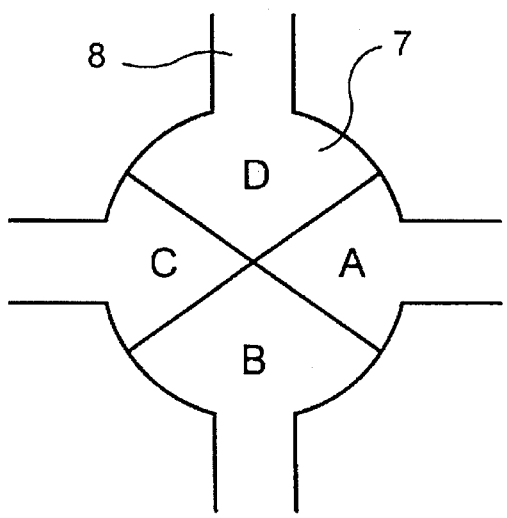
FIG. 3 is a diagrammatic representation of another alignment dot used in the present invention.

Two embodiments of an ABCD alignment dot are shown in FIGS. 2 and 3. Four different metals which emit fluorescent x rays are represented by A, B, C and D, with the lines surrounding these letters delineating the area 7 occupied by each metal. The four metal-containing areas meet at a central intersection 7a. The area 7 occupied by an individual metal may extend in a direction away from the central intersection as shown by area 8 between parallel lines, and terminates at a desired distance from the central intersection. The extended areas may be omitted. The dot is a very small microdot. It may be produced by chemical vapor deposition of the metals, by vacuum evaporation or sputtering, or by photo-etching a thin film containing the metals or compounds of such metals.

To accomplish alignment of the mask with the silicon wafer, the need for positional correction is indicated by the level of fluorescent x rays. If only emission from metal A is detected this means only the A area of the dot is being impinged by the x rays from the x-ray tube passing through the aperture in the mask. Accordingly either the substrate or the mask is moved so that the point at which the areas A, B, C and D meet together is centered under the mask aperture. An off-center position is indicated by a different level of x rays or amount of fluorescent photons among the four types detected.

Alignment may then be done using micro-manipulators. Motor driven micro-manipulators are available which move with 0.15 µm steps. The same manipulator can be manually controlled to produce 0.05 µm steps.

Resulting from the ability to tune or select the emitted energy, the x-ray tube can be designed to emit soft x rays of about 4 KV, typically 4.1 KV, for use in lithography, and higher such as 10–20 or 10–30 KV for microelectronics alignment. Following alignment, the energy can be reduced to 4.1 KV for lithography without replacing the x-ray tube with different equipment. It should be noted that alignment and lithography can be accomplished without need for a vacuum environment.

The use of higher energies for alignment makes it possible to use transition metals for the ABCD dot thus enabling a wider choice of elements, and makes it possible to place the dot on the back of the silicon wafer since the silicon and resist are transparent to the high energy photons. Furthermore, such higher energy photons are transparent to dust and argon, so that the alignment can be done in air and the operation is far simpler than in vacuum.

I claim:

1. A compact x-ray tube assembly of about 9 inches or less in axial length and a diameter of about 4 inches or less comprising an evacuated chamber enclosed by a ceramic tubular envelope, a power supply attached at one end of said envelope and connectable to an electric current supply, emitter means within said chamber and adjacent to said power supply, said emitter means ending in a fine element for emitting an e-beam, electrostatic focusing means within said chamber for focusing said e-beam on a metal foil target, said emitter means and said electrostatic focusing means connected to said power supply, an end window at the opposite end of said envelope comprising an end wall, a window transparent to x rays located in said end wall, an inside surface of said window having thereon said metal foil target, the thickness and composition of the metal foil target and the e-beam energy being selected to generate a microfocused bright beam of x rays of a preselected energy.

2. An x-ray tube according to claim 1, wherein said window is in a tubular extension extending from and of smaller diameter than said evacuated chamber, the interior of said tubular extension being open to said chamber.

3. An x-ray tube according to claim 2, further including an annular magnetic focusing lens surrounding said tubular extension.

4. An x-ray tube according to claim 1, wherein the thickness of said metal foil is from 0.1 to 2 μm.

5. An x-ray tube according to claim 1, wherein said preselected energy is in the range from 10 to 30 KV.

6. An x-ray tube according to claim 5, wherein said preselected energy is below 10 KV.

7. An x-ray tube according to claim 1, wherein said preselected energy is in the range from 13 to 70 KV.

8. An x-ray tube according to claim 1, wherein said ceramic tubular envelope is enclosed within an outer container.

9. An x-ray tube according to claim 8, wherein the annular space between the ceramic tubular envelope and said outer container is filled with an insulating oil.

10. An x-ray tube according to claim 1, wherein said ceramic tubular envelope has a diameter of about 2 inches or less and an axial length of about 2½ inches.

11. An x-ray tube according to claim 10, wherein said power supply has a diameter of about 2 inches and an axial length of about 2 inches.

12. An x-ray tube according to claim 1, wherein said emitter comprises a whisker having an e-beam emitting tip of less than 1μ diameter.

13. An x-ray tube according to claim 1, wherein the ceramic tubular envelope comprises a plurality of tubular sections having edges joined together thereby forming said ceramic tubular envelope.

14. An x-ray tube according to claim 13, wherein the edges of the tubular sections are metallized and the metallized edges are joined together forming metal welds.

15. An x-ray tube according to claim 14, wherein the emitter means and the electrostatic focusing means within the evacuated chamber are electrically connected to separate metal welds of the joined tubular sections, and said metal welds are electrically connected to the power supply through lines external to the ceramic envelope.

16. An x-ray tube according to claim 15, wherein the ceramic tubular envelope is enclosed within an outer container and the annular space between said ceramic tubular envelope and said outer container is filled with an insulating oil.

* * * * *